United States Patent
Chu et al.

(10) Patent No.: US 6,617,253 B1
(45) Date of Patent: Sep. 9, 2003

(54) PLASMA ETCHING METHOD USING POLYMER DEPOSITION AND METHOD OF FORMING CONTACT HOLE USING THE PLASMA ETCHING METHOD

(75) Inventors: Chang-Woong Chu, Suwon (KR); Tae-Hyuk Ahn, Yongin (KR); Sang-Sup Jeong, Suwon (KR); Ji-Soo Kim, Yongin (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/620,022

(22) Filed: Jul. 20, 2000

(30) Foreign Application Priority Data

Jul. 20, 1999 (KR) ............................................. 99-29285
Jul. 14, 2000 (KR) ......................................... 2000-40544

(51) Int. Cl.$^7$ .................... H01L 21/302; H01L 21/3065
(52) U.S. Cl. ........................ 438/702; 438/706; 438/712
(58) Field of Search ................................. 438/702, 706, 438/712

(56) References Cited

U.S. PATENT DOCUMENTS

| | | | | |
|---|---|---|---|---|
| 4,333,793 A | * | 6/1982 | Lifshitz et al. ............. | 156/643 |
| 5,001,083 A | * | 3/1991 | D'Anna ..................... | 438/694 |
| 5,087,857 A | | 2/1992 | Ahn ....................... | 315/111.21 |
| 5,362,358 A | | 11/1994 | Yamagata et al. ........... | 156/643 |
| 5,368,685 A | | 11/1994 | Kumihashi et al. .......... | 216/70 |
| 5,439,849 A | * | 8/1995 | McBride et al. ............. | 438/763 |
| 5,441,595 A | | 8/1995 | Yamagata et al. .......... | 438/701 |
| 5,468,341 A | | 11/1995 | Samukawa .................... | 216/69 |
| 5,614,060 A | | 3/1997 | Hanawa ...................... | 438/720 |
| 5,683,517 A | * | 11/1997 | Shan ....................... | 118/723 E |
| 5,683,538 A | | 11/1997 | O'Neill et al. .............. | 156/345 |
| 5,877,032 A | * | 3/1999 | Guinn et al. ................... | 438/9 |
| 5,895,740 A | * | 4/1999 | Chien et al. ................ | 430/313 |
| 5,942,446 A | * | 8/1999 | Chen et al. ................. | 438/734 |
| 6,251,791 B1 | * | 6/2001 | Tsai et al. ................... | 438/700 |

* cited by examiner

Primary Examiner—Robert Kunemund
Assistant Examiner—Lynette T. Umez-Eronini
(74) Attorney, Agent, or Firm—Marger Johnson & McCollom, P.C.

(57) ABSTRACT

A plasma etching method using selective polymer deposition, and a method of forming a contact hole using the plasma etching method are provided. The plasma etching method uses a method of reinforcing an etch mask by selectively depositing polymer on only a photoresist pattern, which is an etch mask. That is, a dielectric film is plasma etched for a predetermined period of time using the photoresist pattern as an etch mask, and polymer is selectively deposited on only the photoresist pattern which is thinned by plasma etching, thereby forming a polymer layer. Following this, the dielectric film is plasma etched using the photoresist pattern and the polymer layer as a mask. Thus, dielectric film etching providing high resolution and an excellent profile can be performed using the thinned photoresist pattern as a mask, and a contact hole and a self-aligned contact hole each having a very high aspect ratio, and a self-aligned contact hole having an excellent profile, can be formed.

35 Claims, 15 Drawing Sheets

PLASMA ETCHING METHOD USING POLYMER DEPOSITION AND METHOD OF FORMING CONTACT HOLE USING THE PLASMA ETCHING METHOD

BACKGROUND OF THE INVENTION

1. Field of the Invention

The present invention relates to a method of fabricating semiconductor devices, and more particularly, to a plasma etching method using selective polymer deposition and a method of forming a contact hole using the plasma etching method.

2. Description of the Related Art

As the integration density increases, fabrication of semiconductor devices becomes complicated and individual semiconductor devices formed on a substrate have become finer patterns. Photolithographic processing necessarily requires the development of a new photoresist suitable for forming finer patterns.

Generally, the integration of semiconductor devices requires a reduction in the line width of a via hole formed in order to connect conductive material layers having an interlayer dielectric layer therebetween, or the width of a contact hole formed to expose some region of a substrate. The width of a via hole or a contact hole is determined by the line width of a photoresist pattern.

As stated above, with the increase of the integration density of semiconductor devices, it becomes difficult to form a contact hole or via hole using a conventional photolithograhgic process, because the contact hole to be formed becomes smaller than the resolution limit of the optical system, and also because formation of a photoresist pattern having a desired profile becomes difficult.

A method using an exposure beam having a short wavelength to improve the resolution upon the formation of a photoresist pattern is well known as a method for forming a fine pattern.

For example, there is proposed a method using a KrF excimer laser with a 248 $\mu$m wavelength instead of an existing i-line laser with a 365 $\mu$m wavelength as a light source for exposure to fabricate a 256 M-bit dynamic random access memory (DRAM) with a 0.25 $\mu$m design rule.

Also, a beam having a shorter wavelength than the KrF excimer laser must be used to fabricate a 1 G-bit DRAM under a 0.2 $\mu$m design rule using a high-level fine patterning technique. In order to achieve this object, an ArF excimer laser having a 193 nm wavelength is used as a light source for exposure.

However, deep UV rays having a very short wavelength for this ultra-fine pattern processing, or KrF or ArF excimer laser light is highly absorbed by a photoresist film upon exposure. Hence, if a thick photoresist film is formed, light cannot reach the bottom of the photoresist film.

Accordingly, if ArF excimer laser having a short wavelength of 300 nm (=0.3 $\mu$m) is used as a light source for exposure to achieve high resolution patterning, a photoresist must be formed to have a thickness of 3000 Å (=0.3 $\mu$m) or less, considering the beam absorption.

However, such a thin photoresist pattern is not resistant to etching when a silicon oxide film below the photoresist pattern is etched. That is, the silicon oxide film below the photoresist pattern has a low selectivity with respect to the photoresist pattern. Thus, the thin photoresist pattern has a limit in acting as an etch mask, which restricts the depth of the silicon oxide film to be etched.

FIGS. 1A through 1C are cross-sectional views to explain a failure due to an insufficient selectivity with respect to a photoresist pattern when a contact hole is formed by etching a dielectric film using a conventional ArF photolithographic process.

Referring to FIG. 1A, a silicon oxide film 11 is formed as an interlayer dielectric layer on a semiconductor substrate 10. A photoresist pattern 13 is formed thin in order to maximize the resolution upon formation of a fine contact hole. In this case, the photoresist pattern 13 which is used as a mask is not thick enough to sufficiently etch the silicon oxide film 11 to a required depth, when forming deep contact holes.

As shown in FIG. 1B, the thickness of the photoresist pattern 13 is also reduced to form a photoresist pattern 13', when the silicon oxide film 11 is etched under the conventional silicon oxide film anisotropic etching conditions.

Referring to FIG. 1C, when etching is continued in this state to obtain a desired contact depth, part of the photoresist on the periphery of the upper portion of a contact hole is etched, such that the photoresist 13 can no longer sufficiently acts as an etch mask. Thus, the profile of the contact hole becomes inferior.

When a self-aligned contact hole is formed, an interlayer dielectric layer on a gate pattern is etched. And a capping layer, typically formed of silicon nitride, covers a gate electrode acting as a mask for preventing the gate electrode from being exposed during etching of the interlayer dielectric layer. When a deep contact hole is formed using ArF photolithography to obtain high resolution, a very high etch selectivity between a silicon oxide film $SiO_2$ used as an interlayer dielectric layer and a silicon nitride film $Si_3N_4$ used as a capping layer is required.

However, the current etch selectivity has a limit, such that a structural method such as increasing the thickness of the capping layer or forming a thin gate electrode must be used to prevent the gate electrode from being exposed when a deep contact hole is formed.

FIGS. 2A and 2B are cross-sectional views for illustrating a failure due to an insufficient etch selectivity of an interlayer dielectric layer with respect to a capping layer when a conventional self-aligned contact hole is formed.

Referring to FIG. 2A, a gate dielectric layer 25 is formed on a semiconductor substrate 20. Then, a gate pattern is formed on the gate dielectric layer 25. The gate pattern consists of a gate electrode G and a capping layer 29 formed of silicon nitride $Si_3N_4$ on the gate electrode G. Next, a silicon nitride $Si_3N_4$ film is formed on the semiconductor substrate 20 on which the gate pattern has been formed, and is then anisotropically etched, thereby forming capping spacers 27. A silicon oxide film $SiO_2$ 21 is formed as an interlayer dielectric film on the the substrate including the capping layer 29 and the capping spacers 27. A photoresist pattern 23 having a predetermined thickness is formed on the silicon oxide film 21.

Referring to FIG. 2B, the capping layer 29 and the capping spacers 27 are partially etched due to the limit of an etch selectivity of the silicon oxide film 21 with respect to the silicon nitride film when the silicon oxide film is etched to form a self-aligned contact hole, so that the gate electrode G is exposed. This exposure of the gate electrode G causes contact plug charged in a contact hole, and short-circuit the gate electrode G.

A step of simultaneously forming contact holes having different depths is included in a process for manufacturing semiconductor devices. FIG. 3 is a cross-sectional view illustrating where the profile of a contact hole becomes undesirable where contact holes having different depths are formed simultaneously.

Referring to FIG. 3, a silicon oxide layer 31, which is an interlayer dielectric layer having a conductive layer pattern 35 formed at a predetermined height therein, is formed on a semiconductor substrate 30. A photoresist pattern 33 is formed to define contact holes 37 and 39 which expose the conductive layer pattern 35 and the semiconductor substrate 30, respectively. Next, the contact holes 37 and 39 are formed by etching the silicon oxide layer 31. At this time, as shown in FIG. 3, the photoresist pattern 33 is consumed together with the silicon oxide layer 31, such that the profile of each of the contact holes 37 and 39 becomes inferior. Simultaneously, the conductive layer pattern 35 fails to act as an etch stop layer by continuous etching performed to form the contact hole 39, which is deeper than the contact hole 37. Thus, the conductive layer pattern 35 may be penetrated. In this case, a problem such as an increase in contact resistance can occur.

SUMMARY OF THE INVENTION

An object of the present invention is to provide a plasma etching method by which a high resolution and an excellent etch profile can be obtained by allowing a thin photoresist pattern to be used as an etch mask.

Another object of the present invention is to provide a method of forming a contact hole having a good profile using the plasma etching method.

Still another object of the present invention is to provide a method of forming a self-aligned contact hole having a good profile using the plasma etching method.

To achieve the first object, a plasma etching method according to the present invention uses a method of reinforcing an etch mask by selectively depositing polymer on only a photoresist pattern, which is an etch mask. That is, a dielectric film is plasma etched for a predetermined period of time using the photoresist pattern as an etch mask. Polymer is selectively deposited on only the photoresist pattern that is thinned by the plasma etching, thereby forming a polymer layer. Following this, the dielectric film is plasma etched using the photoresist pattern and the polymer layer as a mask. Thus, dielectric film etching providing high resolution can be performed using the thinned photoresist pattern as a mask.

The dielectric film can be etched to a desired depth by repeating the polymer deposition process and the plasma etching process one or more times.

To be more specific, the polymer can be deposited without a bias power supply for accelerating plasma generated by a source power supply, or with the application of power from a bias power supply within a range where polymer deposition is more predominant than plasma etching. Therefore, polymer is thickly formed on only the photoresist pattern around the upper portion of a hole other than on the bottom surface of the hole formed by etching of the dielectric film. Accordingly, the polymer layer is used as an etch mask during plasma etching.

Here, $C_xF_y$-series or $C_aH_bF_c$-series gas is used as an etch gas for plasma etching and polymer deposition. The etch gas further includes an inert gas to allow plasma to be stably produced and polymer to be stably and uniformly deposited on the substrate.

During the polymer deposition, the thickness of a polymer layer on the photoresist pattern, and the thickness of a polymer layer on the bottom surface of a hole formed by etching the dielectric film, can be appropriately controlled by changing process conditions such as the temperature of a substrate, the internal pressure of a reactor, and the average power of a source power supply depending on the application.

Also, in order to remove a polymer layer from the sidewalls of a hole formed by etching of the dielectric film, a gas capable of etching polymer, for example, oxygen, nitrogen, carbon monoxide or carbon dioxide, is further supplied during plasma etching after the polymer deposition. Thus, the diameter of the bottom surface of the hole can be prevented from diminishing as a result of processing.

The plasma etching method described above can be applied to form a contact hole having a high aspect ratio. That is, a contact hole forming method using selective polymer deposition according to the present invention is a method of forming a contact hole by plasma etching a dielectric film using a photoresist pattern-which exposes a predetermined region of the dielectric film-as a mask. In this method, the dielectric film is etched to a predetermined depth by setting the average power of a bias power supply, which is applied to accelerate plasma, to a high level within a range where plasma etching is more predominant than polymer deposition. Then, a polymer layer is selectively formed on the photoresist pattern by setting the average power of a bias power supply to a low level within a range where polymer deposition is more predominant than plasma etching. Thereafter, the dielectric film is plasma etched by re-setting the average power of the bias power supply to the high level.

Here, a deeper contact hole having an excellent profile can be formed by repeating one or more times the step of selectively forming a polymer layer on the photoresist pattern and the subsequent plasma etching step.

In particular, in order to form a contact hole having a high aspect ratio, it is preferable that process conditions, for example, the temperature of a substrate, the internal pressure of a reactor, and the average power of a source power supply, are controlled to make the thickness of a polymer layer, formed upon the polymer deposition, on a photoresist pattern sufficiently greater than the thickness of a polymer layer on the bottom surface of a hole formed by etching a dielectric film, thereby to increase the difference between the two thicknesses.

The plasma etching method described above can be applied to form a self-aligned contact hole. That is, a self-aligned contact hole forming method using selective polymer deposition according to the present invention is a method of forming a dielectric film on a substrate on which a predetermined conductive layer pattern and a capping portion for covering the conductive layer pattern are formed, and plasma etching the dielectric film, thereby forming a self-aligned contact hole while exposing a part of the capping portion. In this method, primary plasma etching is performed on the dielectric film using the photoresist pattern as a mask to expose a part of the capping portion. Then, polymer is selectively deposited on the photoresist pattern and on the exposed capping portion to form a polymer layer. Next, secondary plasma etching is performed on the dielectric film using the photoresist pattern, the capping portion and the polymer layer on the photoresist pattern and on the capping portion as a mask. In this way, a self-aligned contact hole having an excellent profile, which does not expose the conductive layer pattern, is formed.

Here, upon the first plasma etching, similar to the aforementioned plasma etching method and the aforementioned contact hole forming method, polymer deposition and plasma etching can be repeated one or more times. Likewise, a deeper self-aligned contact hole can be formed by repeating one or more times the step of forming a polymer layer on the exposed capping portion and on the photoresist pattern and the secondary plasma etching step.

The polymer deposition can be achieved by setting the bias power supply that is applied to a substrate to a low level, similar to the plasma etching method and contact hole forming method described above.

Also, it is preferable that the remaining process conditions, for example, the temperature of a substrate, the internal pressure of a reactor, and the average power of a source power supply, be controlled to reduce the difference between the thickness of a polymer layer on a photoresist pattern and the thickness of a polymer layer on the bottom surface of a contact hole, so that a polymer layer can be formed on a capping portion to have an appropriate thickness. These process conditions are also effective when contact holes having different depths are formed simultaneously.

Therefore, a narrow and deep contact hole providing high resolution and an excellent profile, which are required by highly-integrated semiconductor devices, can be easily formed.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

A plasma etching method using selective polymer deposition according to the present invention, and embodiments of a contact hole forming method using the plasma etching method, will now be described with reference to the attached drawings. First, the plasma etching method using selective polymer deposition according to the present invention will be described with reference to FIG. 4.

Figure 4:
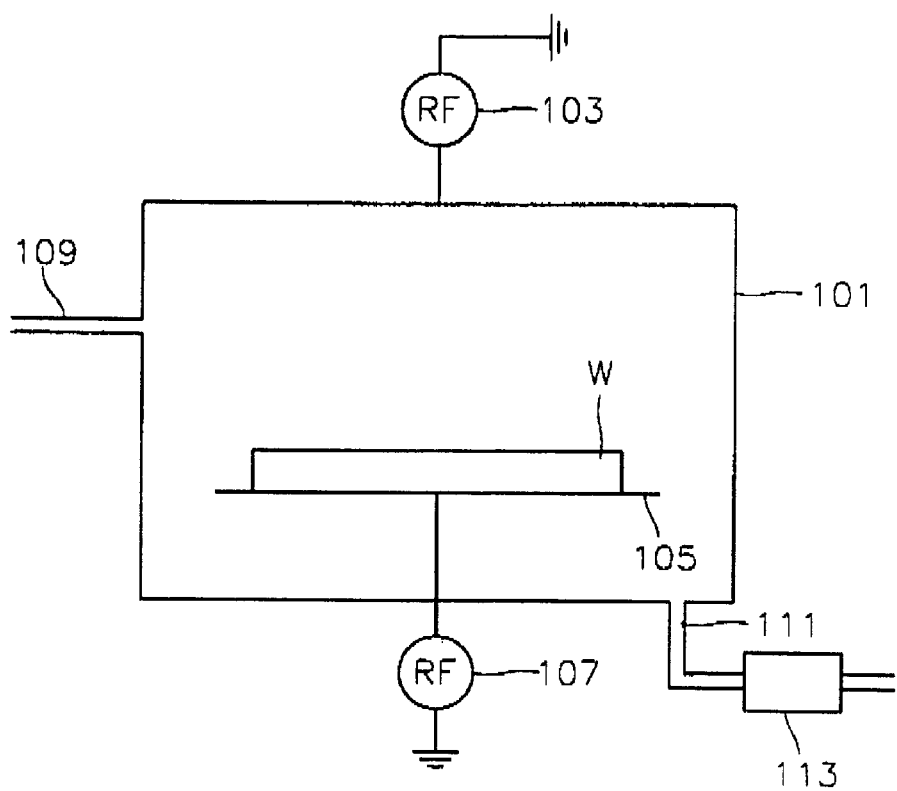
FIG. 4 is a schematic view of a plasma reactor used in plasma etching according to the present invention.

FIG. 4 is a schematic view of a typical plasma reactor used in plasma etching according to the present invention. Referring to FIG. 4, a plasma reactor 101 includes a wafer support 105 on which a wafer W to be etched is placed. The wafer support 105 includes a heater or cooling means (not shown) for controlling the temperature of a substrate. The plasma reactor 101 also includes a gas inlet 109 for supplying a plasma gas or an etch gas, an outlet 111 for exhausting gas, and a pump 113 for controlling the internal pressure of the reactor 101. A source power supply 103 for supplying RF power for generating plasma is connected to the plasma reactor 101 from above, and a bias power supply 107 for supplying bias RF power to the wafer W is connected to the wafer support 105.

When plasma etching is performed using the plasma reactor shown in FIG. 4, in the prior art, a predetermined level of source power supply 103 and a predetermined level of bias power supply 107 are continuously applied for a predetermined period of time, and plasma is thus generated by the source power supply and accelerated by the bias power supply, thereby etching a dielectric layer on the wafer W. In order to solve the above-described problems of the prior art, in the present invention, polymer is selectively deposited on only the upper surface of a photoresist pattern during plasma etching of a dielectric layer, and thus an excellent etch profile can be obtained using the deposited polymer layer and the photoresist pattern as an etch mask.

Figure 5:
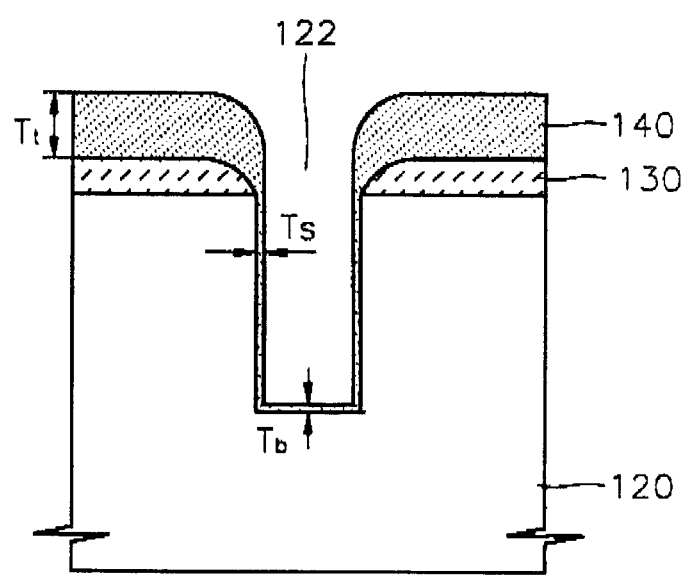
FIG. 5 is a cross-sectional view of a hole that is in an etching process, to explain a plasma etching method according to the present invention.

In other words, as shown in FIG. 5, a dielectric layer 120, for example, a silicon oxide film formed by chemical vapor deposition, is plasma etched to a predetermined depth using a photoresist pattern 130 as an etch mask. Next, a polymer layer 140 is formed by depositing polymer on only the upper surface of the photoresist pattern 130, before the photoresist pattern 130 is consumed and thus no longer acts as an etch mask. Following this, the dielectric layer 120 is plasma etched again using the photoresist pattern 130 and the polymer layer 140 as an etch mask, thereby obtaining a desired etch depth. Here, the polymer deposition and the plasma etching are repeated one or more times, so that the polymer layer 140, which is consumed during etching, is supplemented. Consequently, the dielectric layer 120 can be etched deeper.

To be more specific, the polymer layer 140 can be formed without applying power from the bias power supply 107 or by applying a low level of power from the bias power supply 107 within a range where polymer deposition is more predominant than accelerated plasma etching of the dielectric film 120. Accordingly, as shown in FIG. 5, the polymer layer 140 is selectively formed on only the upper surface of the photoresist pattern 130. At this time, polymer is also deposited on the sidewalls and bottom surface of a hole 122 formed by etching the dielectric layer 120, but the thicknesses Ts and Tb are thin enough to be disregarded, compared to the thickness Tt of a polymer layer 140 deposited on the upper surface of the photoresist pattern 130.

Figure 6:
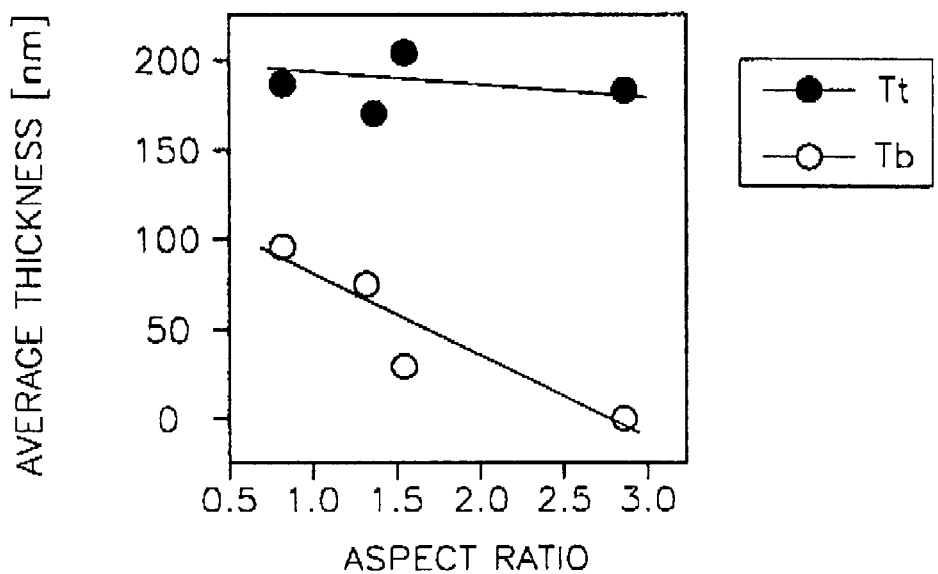
FIGS. 6 through 8 are graphs showing the thickness of a polymer layer on a photoresist pattern and the thickness of a polymer layer on the bottom surface of a hole, according to variations in the aspect ratio of the hole, the temperature of a substrate, and the internal pressure of a reactor, respectively, in a plasma etching method according to the present invention.

FIG. 6 is a graph showing the thickness (Tt) of a polymer layer 140 on the photoresist pattern 130 and the thickness (Tb) of a polymer layer 140 on the bottom surface of the hole 122 according to a variation in the aspect ratio of the hole 122 formed by the etching of the dielectric layer 120. Here, the average source power is 2900W; the average bias power is 200W (the average bias power of a bias power supply applied to a plasma reactor upon plasma etching is about 1000 to 2000W); the temperature of the substrate is 0° C.; the internal pressure of the reactor is 30 mTorr; $C_4F_8$ and Ar are used; the flow rate of the gas $C_4F_8$ is 30 sccm; the flow rate of Ar is 800 sccm; and the reacting time is 40 seconds.

Referring to FIG. 6, as the aspect ratio of the hole 122 increases, that is, as the depth of the hole 122 increases, the thickness (Tb) of a polymer layer on the bottom surface of the hole 122 sharply decrease. This indicates that the thickness (Tb) of a polymer layer on the bottom surface of the hole 122 is small enough to be disregarded, compared to the thickness (Tt) of a polymer layer 140 deposited on the upper surface of the photoresist pattern 130. Consequently, it can be seen that polymer is selectively deposited on only the upper surface of the photoresist pattern 130.

The thickness (Tt) of the polymer layer 140 on the photoresist pattern 130, and the thickness (Tb) of the polymer layer on the bottom surface of the hole 122, have different distributions according to several process conditions. This will now be described in detail.

Figure 7:
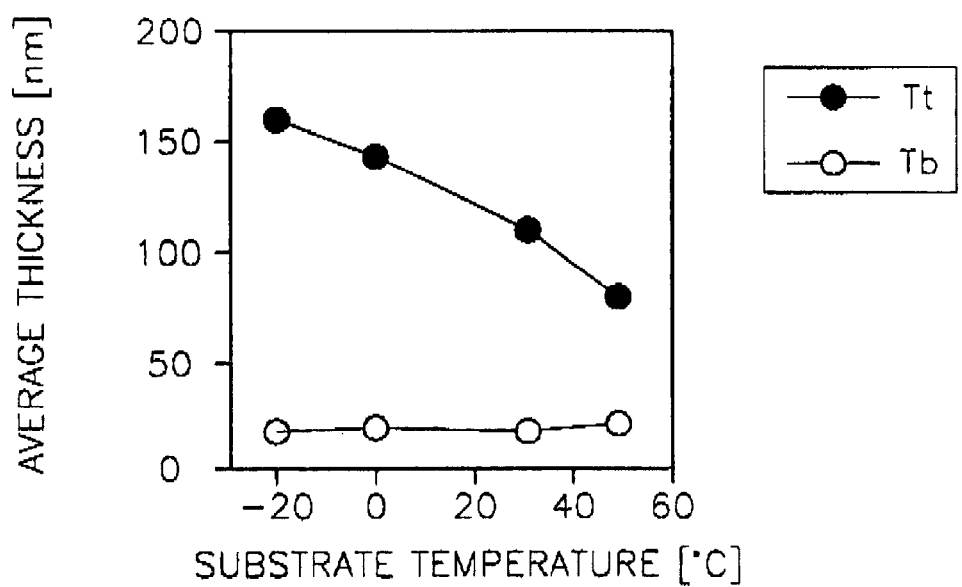

FIG. 7 is a graph showing the thickness (Tt) of the polymer layer 140 on the photoresist pattern 130 and the thickness (Tb) of the polymer layer on the bottom surface of the hole 122 according to a variation in the temperature of a substrate. Here, the conditions of an experiment are the same as those of FIG. 6 except for the substrate temperature which varies between −20° C. and 60° C.

It is shown in FIG. 7 that the thickness (Tt) of the polymer layer 140 formed on the photoresist pattern 130 sharply decreases as the substrate temperature increases, while the thickness (Tb) of the polymer layer formed on the bottom surface of the hole 122 gradually increases as the substrate temperature increases.

Figure 8:
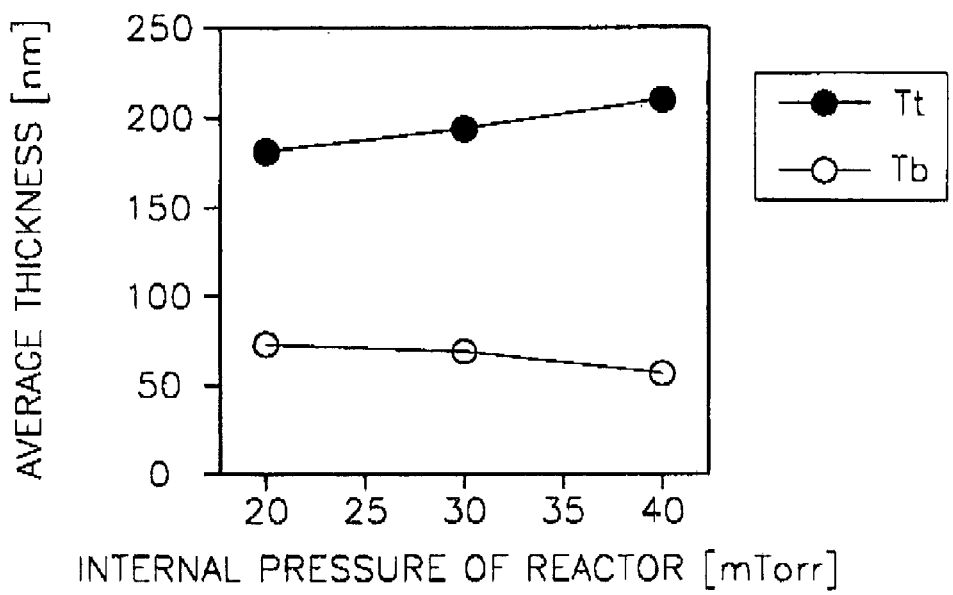

FIG. 8 is a graph showing the thickness (Tt) of the polymer layer 140 on the photoresist pattern 130 and the thickness (Tb) of the polymer layer on the bottom surface of the hole 122 according to a variation in the internal pressure of the reactor 101. Here, the experimental conditions are the same as those of FIG. 6 except that the internal pressure of the reactor varies from 0 to 40 mTorr.

It is shown in FIG. 8 that the thickness (Tt) of the polymer layer 140 on the photoresist pattern 130 increases as the internal pressure of the reactor 101 increases, while the thickness (Tb) of the polymer layer formed on the bottom surface of the hole 122 decreases as the internal pressure of the reactor increases.

Figure 9:
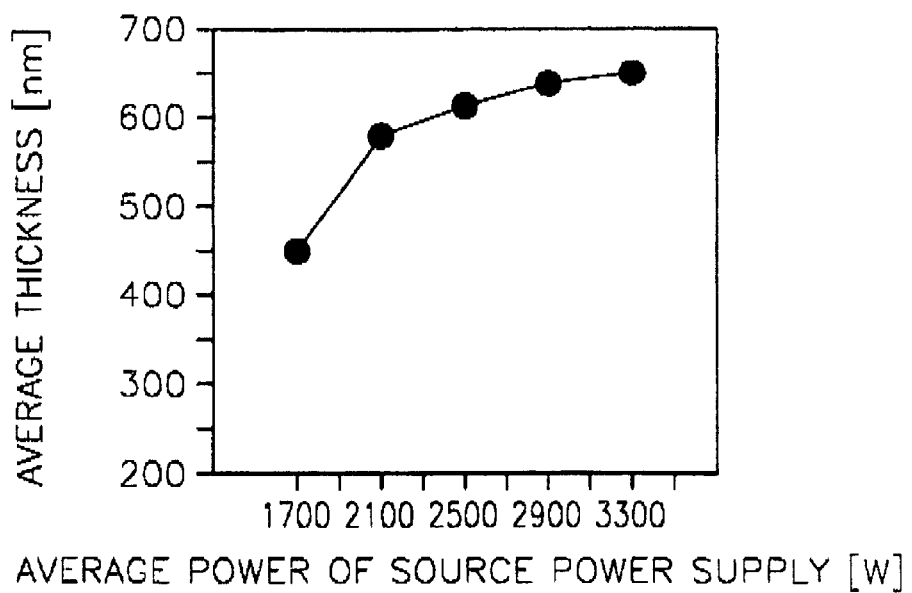
FIGS. 9 through 12 are graphs showing the thickness of a polymer layer, the ratio of the thickness of a polymer layer on a photoresist pattern to the thickness of a polymer layer on the bottom surface of a hole, an etch selectivity of a silicon oxide film with respect to an etch mask, and an etch selectivity of a silicon oxide film with respect to polycrystal silicon, according to variations in the average power of a source power supply, respectively, in a plasma etching method according to the present invention.

FIG. 9 is a graph showing the thickness of a polymer layer according to a variation in the average power of the source power supply 103. In contrast with the above-described experiments, this experiment refers to a case where a polymer layer is formed on a silicon substrate having no patterns formed thereon. Here, the conditions of this experiment are the same as those of FIG. 6 except that the average power of the source power supply 103 varies within a range of 1700W to 3300W.

It is shown in FIG. 9 that the thickness of the polymer layer 140 increases as the average power of the source power supply 103 increases.

Figure 10:
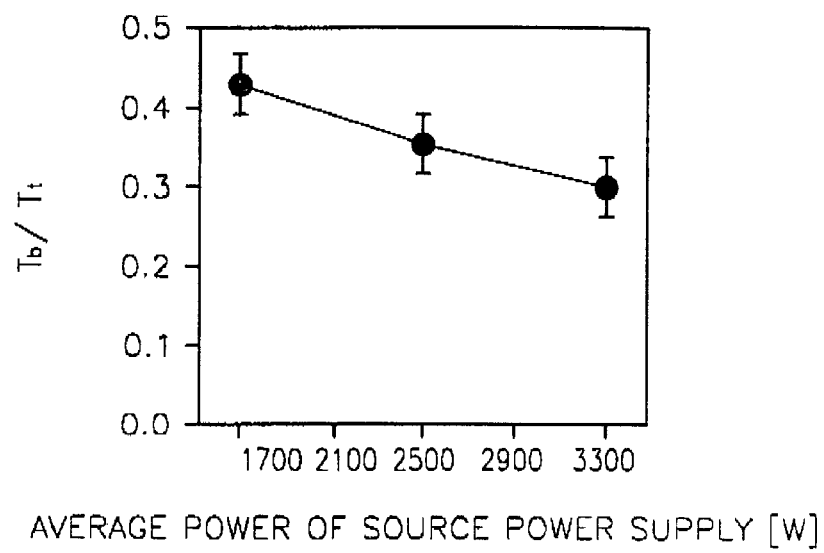

FIG. 10 is a graph showing the ratio of the thickness (Tb) of the polymer layer on the bottom surface of the hole 122 to the thickness (Tt) of the polymer layer 140 on the photoresist pattern 130, according to variations in the average power of the source power supply 103 applied to the dielectric film 120 having the hole 122 formed therein as in the experiments of FIGS. 6 through 8. Here, the conditions of this experiment are the same as those of FIG. 9.

It is shown in FIG. 10 that the ratio of Tb/Tt decreases as the average power of the source power supply 103 increases. That is, as the average power of the source power supply 103 increases, the thickness (Tb) of the polymer layer on the bottom surface of the hole 122 decreases compared to the thickness (Tt) of the polymer layer 140 on the photoresist pattern 130, and the difference between the thicknesses Tt and Tb increases.

Figure 11:
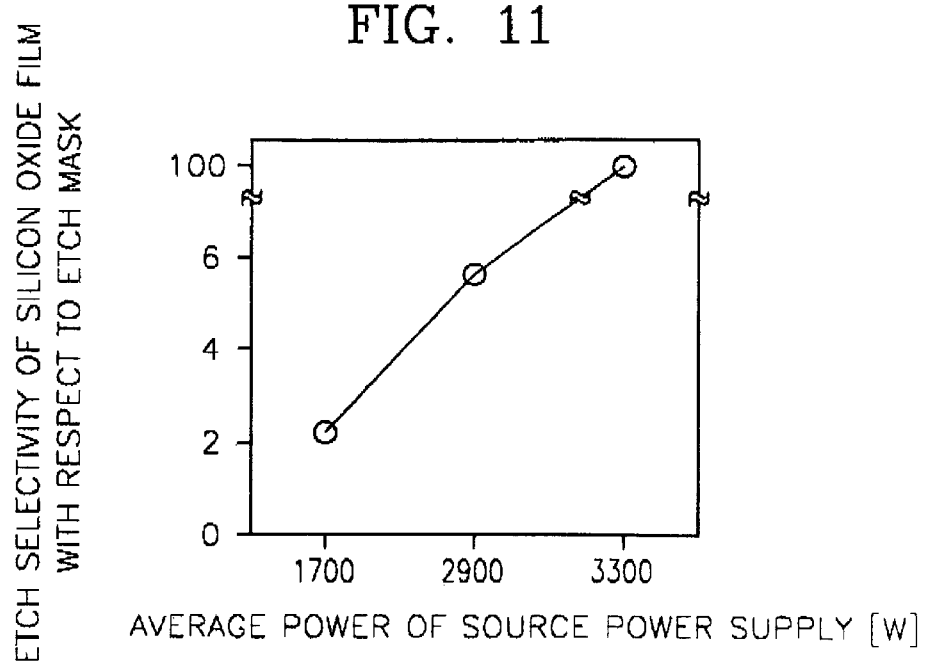

FIG. 11 is a graph showing an etch selectivity of the dielectric layer 120, that is, a silicon oxide film, with respect to an etch mask, that is, the photoresist pattern 130 and the polymer layer 140, according to variations in the average power of the source power supply 103.

It is shown in FIG. 11 that the etch selectivity rapidly increases as the average power of the source power supply 103 increases. Considering that the etch selectivity of a silicon oxide film with respect to photoresist upon typical plasma etching is about 4:1, it can be seen that an etching method according to the present invention can increase the etch selectivity to a desired level by selectively forming the polymer layer 140 on the thinned photoresist pattern 130.

Figure 3:
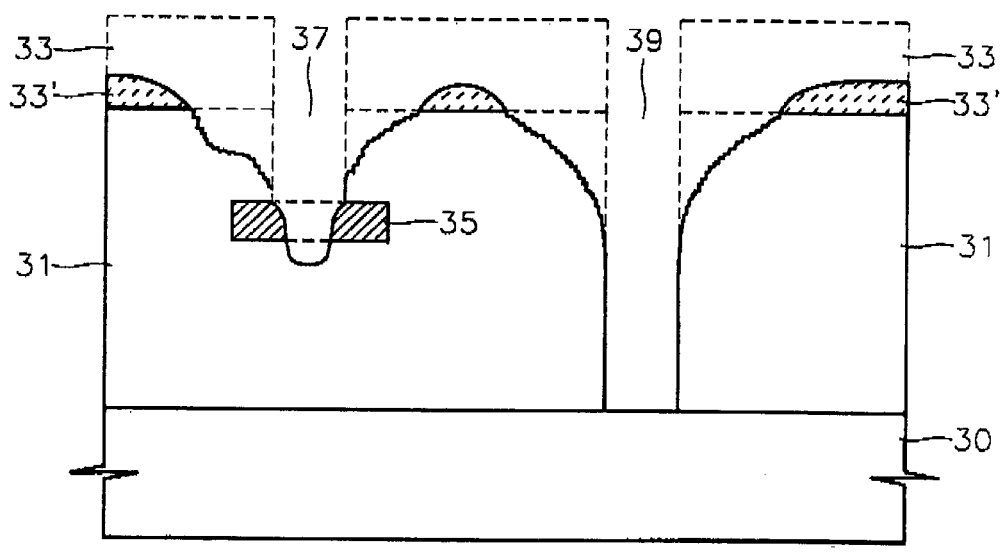
FIG. 3 is a cross-sectional view for illustrating a procedure of simultaneously forming contact holes having different depths using the conventional dielectric film etching method.
Figure 12:
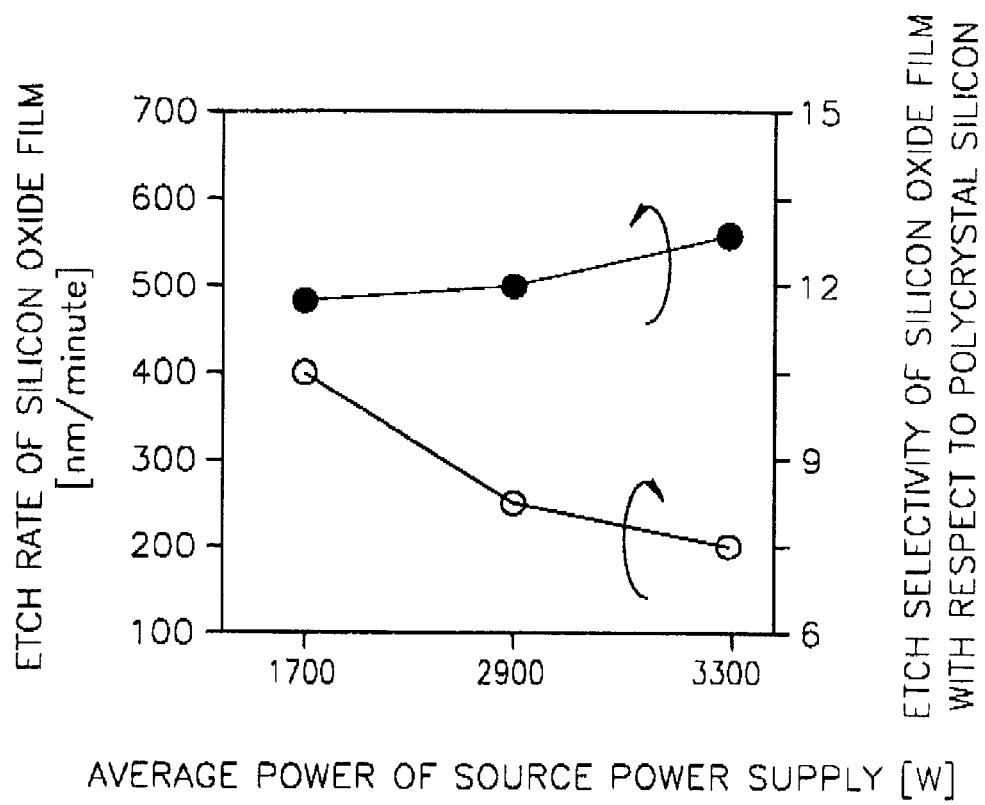

FIG. 12 is a graph showing an etch selectivity of the silicon oxide film 31 with respect to the conductive layer pattern 35 which is exposed by the shallow contact hole 37 as shown in FIG. 3 and formed of polycrystalline silicon, and the etch rate of the silicon oxide film, according to variations in the average power of the source power supply 103.

Referring to FIG. 12, as the average power of the source power supply 103 decreases, the etch rate (●) of the silicon oxide film decreases while the etch rate (not shown) of polycrystalline silicon rapidly decreases. Consequently, it is shown that the etch selectivity (○) of the silicon oxide film with respect to the polycrystal silicon increases. Accordingly, it is preferable to lower the average power of the source power supply 103 among the polymer deposition conditions when the contact holes 37 and 39 having different depths, which expose the conductive layer pattern 35 and the substrate 30, respectively, are formed simultaneously as shown in FIG. 3.

Also, the thickness of the polymer layer 140 varies according to the types of etch gas used. Table 1 shows the deposition rate of the polymer layer 140 on the photoresist pattern 130 per time depending on the type of etch gas.

TABLE 1

| Type of gas | $C_4H_8$ | $CHF_3$ | $CH_2F_2$ | $C_4H_8 + CH_2F_2$ |
|---|---|---|---|---|
| Deposition rate (A/min) | 7800 | 4980 | 4800 | 7780 |

Here, the average source power is 2900W, the average bias power is 200W, the temperature of the substrate is 0° C., the internal pressure of the reactor is 30 mTorr, the flow rate of gas is 30 sccm, the flow rate of inert Ar gas is 800 sccm, and the reacting time is 40 seconds.

It can be seen from Table 1 that as the content of carbon (C) increases, the deposition rate increases, that is, the thickness (Tt) of the polymer layer 140 on the photoresist pattern 130 increases. Accordingly, the difference between the thickness (Tt) of the polymer layer 140 on the photoresist pattern 130 and the thickness (Tb) of the polymer layer on the bottom surface of the hole 122 also increases.

The deposition profile of polymer can be controlled on the basis of the several above-described variables for polymer layer formation. Embodiments of forming a contact hole by etching a dielectric layer (silicon oxide layer) using the above-described plasma etching method according to the present invention and the results of the above experiments, will now be described in detail.

First Embodiment

In this embodiment, a deep contact hole, that is, a contact hole having a high aspect ratio, is formed by a plasma etching method using selective polymer deposition.

Figure 13:
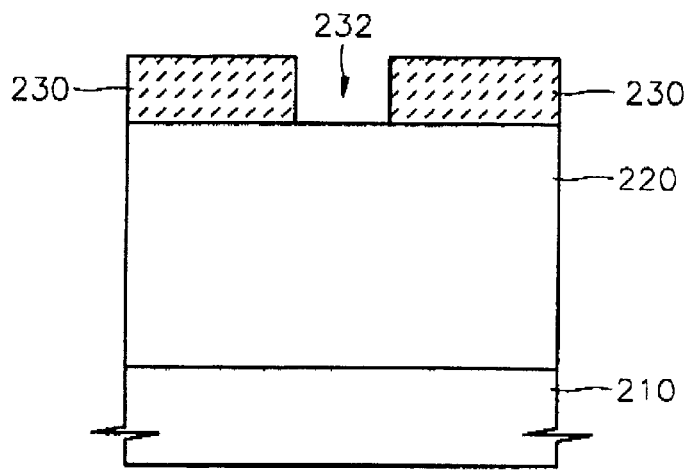
FIGS. 13 through 18 are cross-sectional views illustrating a process for forming a contact hole having a high aspect ratio, according to an embodiment of the present invention.

FIGS. 13 through 15, 17 and 18 are cross-sectional views for illustrating a process for forming a contact hole having a high aspect ratio according to the first embodiment of the present invention. Referring to FIG. 13, a dielectric film 220, for example, a silicon oxide film, is formed on a conductive layer 210 to have a thickness of 1–5 µm, preferably, 2 µm, by chemical vapor deposition (CVD). Here, the conductive layer 210 can be a metal wiring, a doped polycrystalline silicon layer, or an active region of a semiconductor substrate.

Next, the entire surface of the dielectric layer 220 is coated with a photoresist. In order to maximize the resolution, the photoresist is formed thinly to a thickness of about 0.5 to 1.2 µm, preferably, 0.7 µm. Thereafter, the photoresist is exposed and developed using an ArF excimer laser light source to achieve a high resolution, thereby forming a photoresist pattern 230 that defines a contact hole. Here, the photoresist pattern 230 is formed to have an aperture 232, the diameter of which is about 0.2 to 0.5 µm, preferably, 0.3 µm.

A wafer W on which the photoresist pattern 230 is formed is introduced into a plasma reactor 101 as shown in FIG. 4 to undergo a plasma etching process. An etch gas is injected into the plasma reactor 101 having the wafer W, via an inlet 109. A wafer support 105, on which the wafer W is seated, and the plasma reactor 101 are supplied with power from the bias power supply 107 and the source power supply 103, respectively. In this way, plasma etching starts.

$C_xF_y$-series or $C_aH_bF_c$-series gasses, which allow polymer formation, such as $CF_4$, $CHF_3$, $C_2F_6$, $C_4F_8$, $CH_2F_2$, $CH_3F$, $CH_4$, $C_2H_2$, or $C_4F_6$, can be used as the etch gas. Also, the plasma reactor 101 can be charged with an inert gas such as He, Ar, Xe, or I for allowing plasma to be formed stably and polymer to be deposited on a substrate stably and uniformly.

The source power supply 103 for generating plasma, and the bias power supply 107 for accelerating generated plasma, apply different amounts of RF power according to the type of plasma etching equipment. In plasma equipment used in this embodiment, the source power supply 103 and the bias power supply 107 apply RF power of 2000 to 3000W and RF power of 1000 to 1500W, respectively.

Figure 1A:
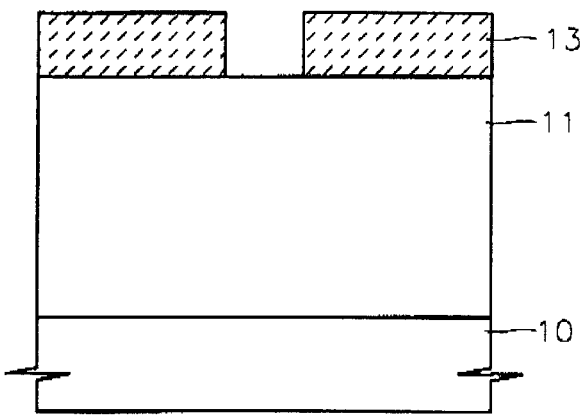
FIGS. 1A through 1C are cross-sectional views for illustrating a procedure of forming a contact hole having a high aspect ratio using a conventional dielectric film etching method.
Figure 1B:
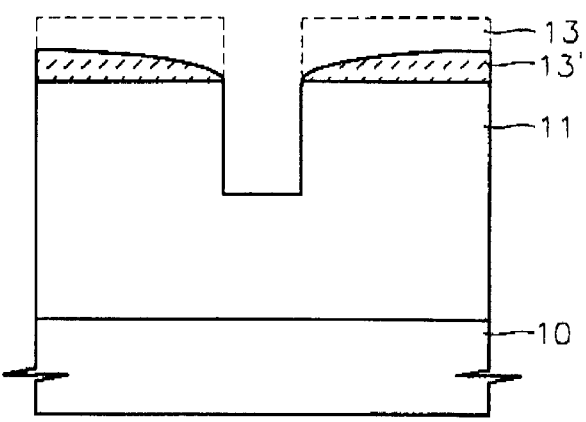
Figure 1C:
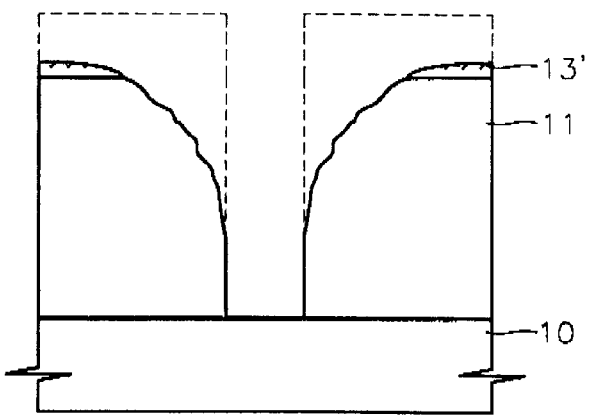
Figure 14:
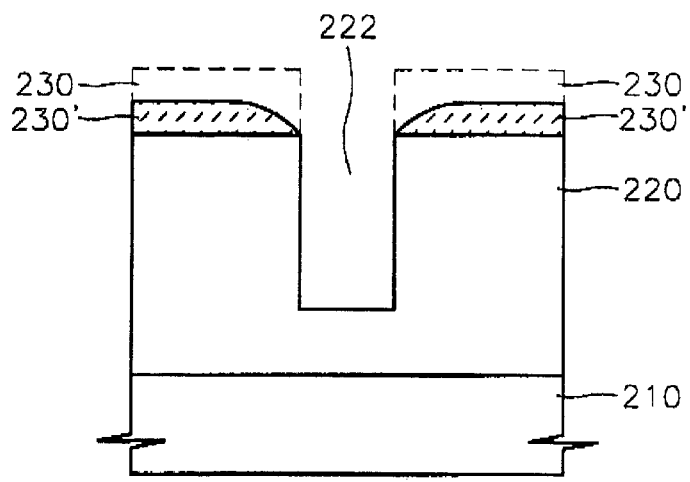

The average power of the source power supply 103 and the average power of the bias power supply 107 are set to be values described above. In this condition, the dielectric film 220 is plasma etched using the photoresist pattern 230 as an etch mask for a predetermined period of time (about 1 to 3 minutes). Consequently, as shown in FIG. 14, the dielectric film 220 formed of silicon oxide is etched by a depth of 0.6 to 2.0 µm, and the photoresist pattern 230 is etched to have a thickness of about 0.2 to 0.3 µm. For example, when $C_4F_6$ is used as the etch gas, the dielectric layer 220 is etched by 1.8 µm for three minutes, and the thickness of an upper photoresist pattern 230' is reduced to 0.3 µm. In particular, the upper photoresist pattern 230' around the upper portion of a contact hole 222 formed by the etching of the dielectric film 220 is further etched as shown in FIG. 14. In this state, if the plasma etching is continuously performed, the profile of the contact hole becomes undesirable or inferior as shown in FIG. 1C.

Figure 15:
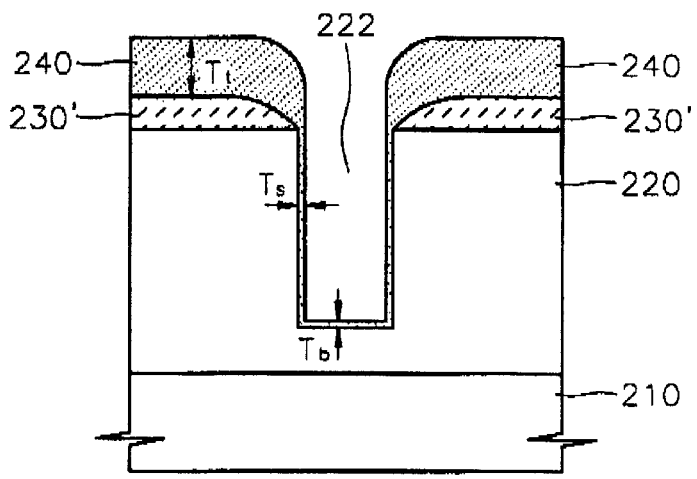

In a state as shown in FIG. 14, the power from the bias power supply 107 is not applied, or a low level of power within a range where polymer deposition is more predominant than plasma etching, for example, RF power of 0 to 900W, is applied for a predetermined period of time (for about 15 to 40 seconds). Consequently, as shown in FIG. 15, polymer is actually deposited on only the upper surface of the photoresist pattern 230', thereby forming a polymer layer 240. That is, the polymer layer 240 having a thickness of 0.2 to 0.5 µm is formed on the photoresist pattern 230' by a gas selected from the group consisting of $CF_4$, $CHF_3$, $C_2F_6$, $C_4F_8$, $CH_2F_2$, $CH_3F$, $CH_4$, $C_2H_2$ and $C_4F_6$, within the plasma reactor 101.

As described above, the deposition thickness and profile of the polymer layer 240 vary with several variables such as the average power of a source power supply, the types of the etching gas, the internal pressure of a reactor, and the temperature of a substrate. Therefore, the polymer layer 240 having a desired thickness, and a desired profile can be obtained by controlling the variables considering the results of the above experiment.

In this embodiment, the polymer layer 240 is formed on the photoresist pattern 230' to be used as an etch mask for complementing the thickness of the thinned photoresist pattern. Hence, it is preferable that the thicknesses (Tb) and (Ts) of a polymer layer on the bottom surface and on the sidewall of the contact hole 222, respectively, are as much smaller as possible than the thickness (Tt) of a polymer layer on the photoresist pattern 230'. In this embodiment, the polymer layer 240 has a thickness of 0.5 to 1.2 µm on the photoresist pattern 230', while it has a thickness of 500 Å (=0.05 µm) or less on the bottom surface of the contact hole 222. Considering the results of the above experiment, it is preferable to set the process conditions as described below to obtain the polymer layer 240 having the above-described deposition profile.

Figure 16:
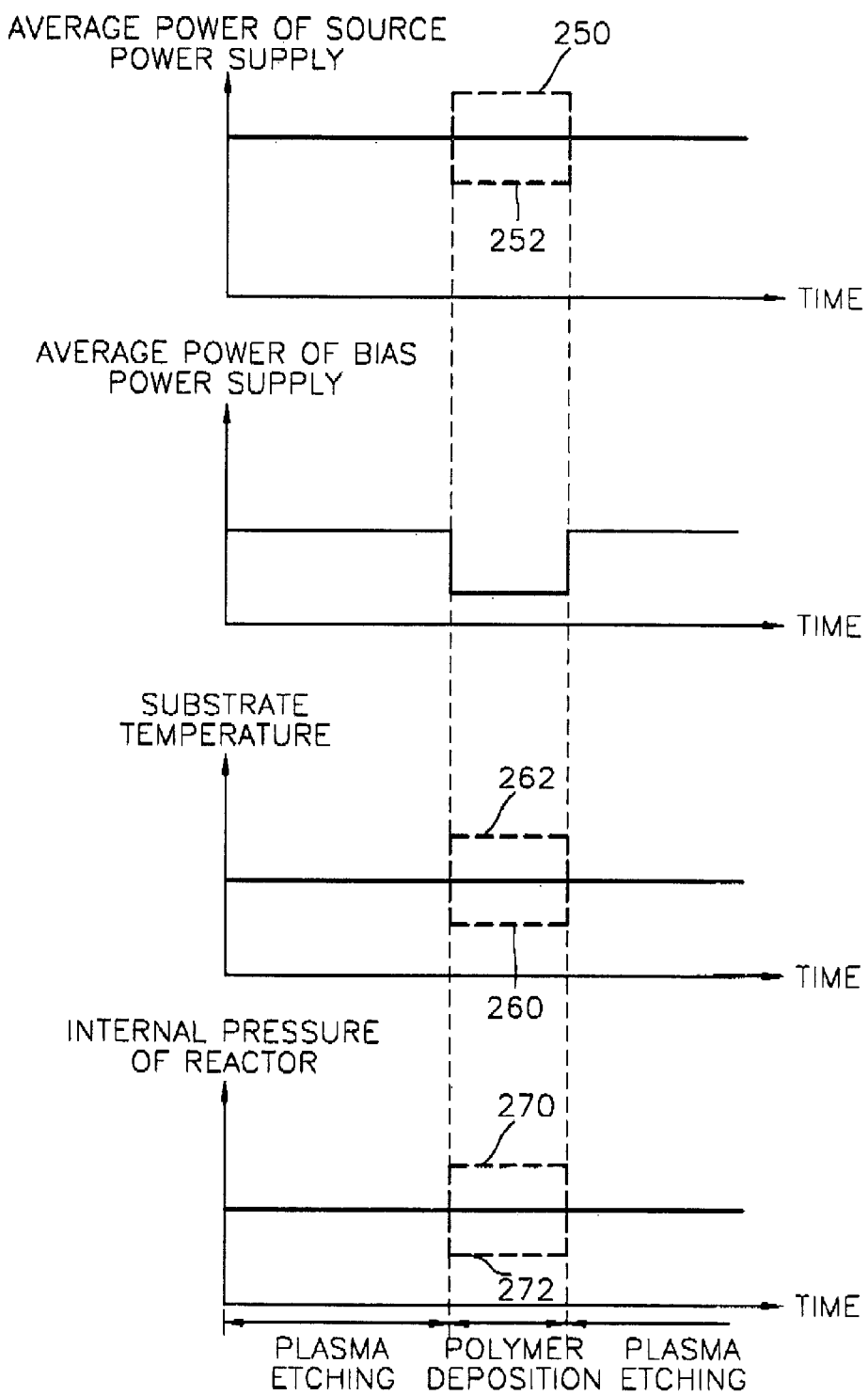

That is, referring to FIG. 16, during polymer deposition, the average power of a bias power supply is maintained at a low level, the average power of a source power supply is maintained at a high level 250, the substrate temperature is set to be a low level 260, and the internal pressure of a reactor is set to be a high level 270. Here, the average power of a bias power supply must be maintained at a low level during the polymer deposition, but the average power of a source power supply, the substrate temperature, and the internal pressure of a reactor may be set to be a high level, a low level, and a high level, respectively, or can maintain the same level as the level that is established and maintained during plasma etching.

Figure 17:
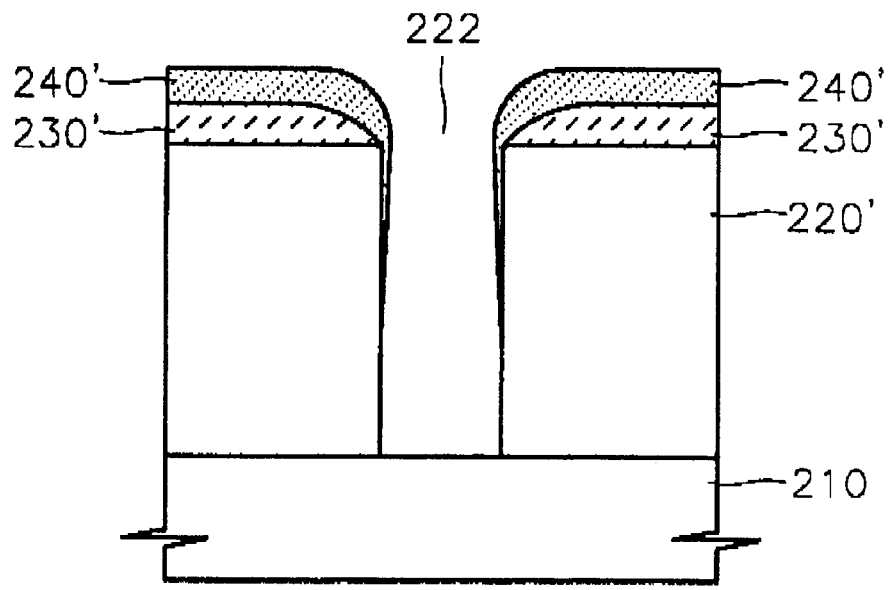

After the polymer layer 240 is formed as described above, as shown in FIG. 16, plasma etching is performed for a predetermined period of time (about 1–2 minutes), by returning the average power of the source power supply 103, the average power of the bias power supply 107, the substrate temperature, and the internal pressure of the reactor 101 to the levels in a plasma etching step. Accordingly, as shown in FIG. 17, the thinned photoresist pattern 230' and the polymer layer 240 act as an etch mask, and thus the dielectric film 220 can be etched deeper without a failure in the profile of the contact hole 222. During the plasma etching for 1–2 minutes, the dielectric film 220 is continuously etched to expose the conductive layer 210. At this time, the polymer layer 240 is also plasma etched to become a polymer layer 240' having a thickness of about 0 to 0.2 $\mu$m.

If a silicon oxide film is plasma etched using a $C_xF_y$-series or $C_aH_bF_c$-series gas, for example, $C_4F_8$, the etch selectivity of a $C_xF_y$-family or $C_aH_bF_c$-family polymer layer with respect to a silicon oxide film $SiO_2$ is about 4–5:1. Considering the fact that the etch selectivity of photoresist with respect to the silicon oxide film $SiO_2$ is about 4:1, it can be seen that the polymer layer 240 formed according to the present invention can act sufficiently as an etch mask.

Figure 18:
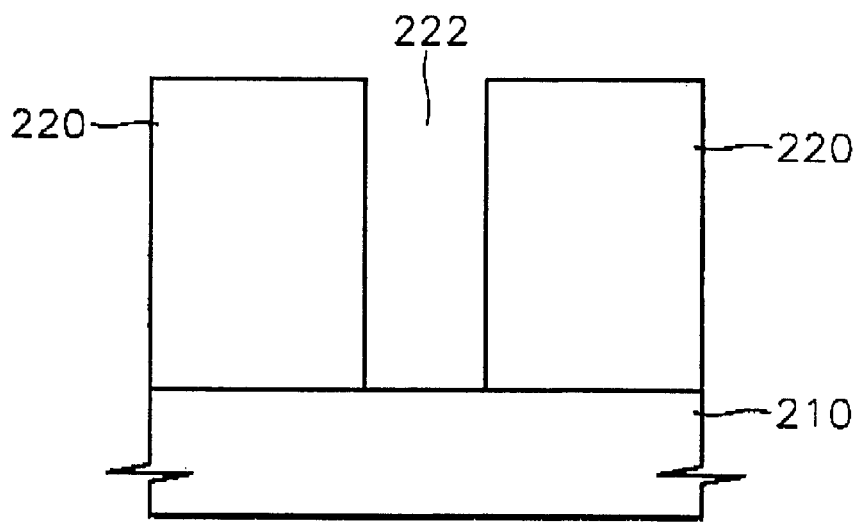

Thereafter, as shown in FIG. 18, the remaining polymer layer 240' and the remaining photoresist pattern 230' in FIG. 17 are removed, thereby completing the formation of a narrow and deep contact hole, for example, the contact hole 222 having an aspect ratio of 6–7:1 with a diameter of 0.2 to 0.5 $\mu$m.

Also, a contact hole having a higher aspect ratio and an excellent profile can be formed by repeating one or more times the step of forming the polymer layer 240 on the photoresist pattern 230' and the step of performing plasma etching using the polymer layer 240 and the photoresist pattern 230' as an etch mask.

In the polymer deposition step, the polymer layer 240, though it is only a tiny amount, is also deposited on the sidewalls of the etched hole 222 (see Ts in FIG. 15). The polymer deposited on the sidewalls of the etched hole is not easily removed even by subsequent plasma etching, and the diameter of the bottom surface of the contact hole 222 becomes narrower as the plasma etching proceeds. This increases a contact resistance, and in a worse case, a contact hole may not be open. In order to solve this problem, a gas capable of etching polymer can be further supplied in the plasma etching step of this embodiment. That is, in the plasma etching step following the polymer deposition step, when a small amount of gas capable of etching polymer, for example, oxygen ($O_2$), nitrogen ($N_2$), carbon monoxide (CO) or carbon dioxide ($CO_2$), in addition to the $C_xF_y$-series or $C_aH_bF_c$-series gas, is supplied, the polymer deposited on the sidewall of the contact hole 222 is removed. Thus, the reduction of the diameter of the bottom surface of the contact hole 222 is prevented. As a gas capable of etching polymer is added, the thickness (Tt) of the polymer layer 240 formed on the photoresist pattern 230' is also reduced, but it is considerably greater than the thicknesses (Tb) and (Ts). Accordingly, the reduction of the thickness (Tt) does not affect the use of the polymer layer 240 as an etch mask.

Figure 19:
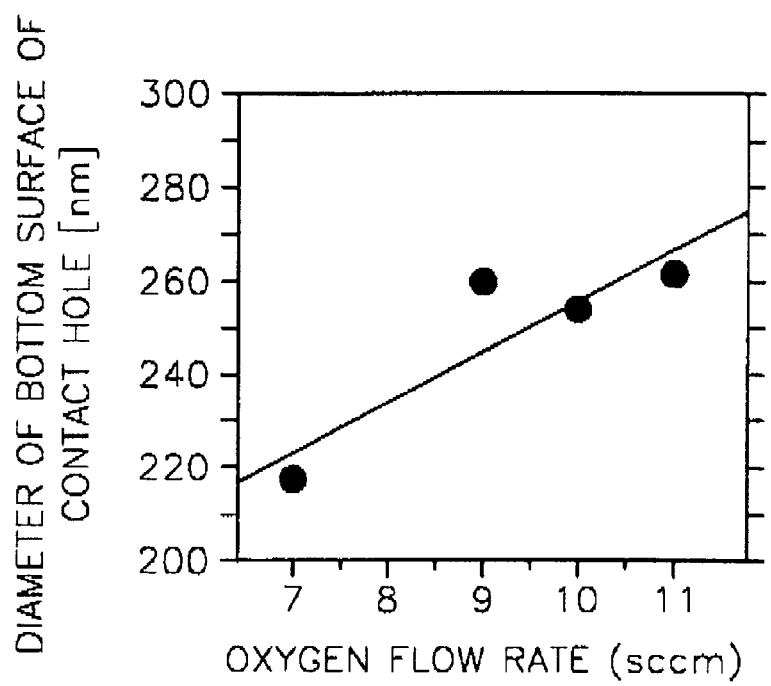
FIG. 19 is a graph showing the diameter of the bottom surface of a contact hole according to variations in the flow rate of oxygen gas which is added upon plasma etching in a contact hole forming method according to an embodiment of the present invention.

FIG. 19 is a graph showing a variation in the diameter of the bottom surface of a contact hole according to a variation in the flow rate of oxygen that is added during the plasma etching. It can be seen from FIG. 19 that a reduction of the diameter of the bottom surface of a contact hole is considerably suppressed as the flow rate of oxygen increases.

Figure 20:
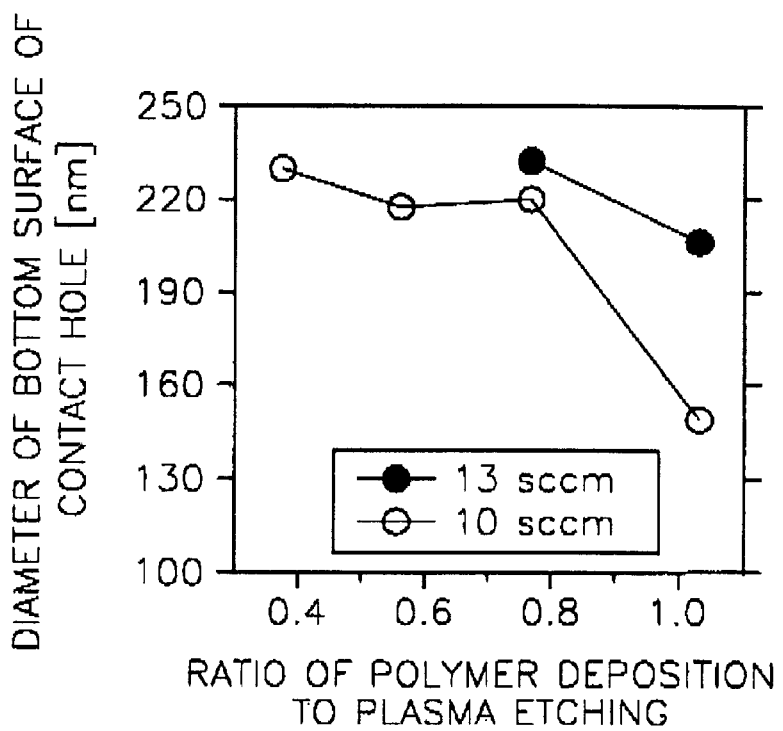
FIG. 20 is a graph showing the diameter of the bottom surface of a contact hole according to variations in the ratio of polymer deposition to plasma etching in a contact hole forming method according to an embodiment of the present invention.
Figure 21:
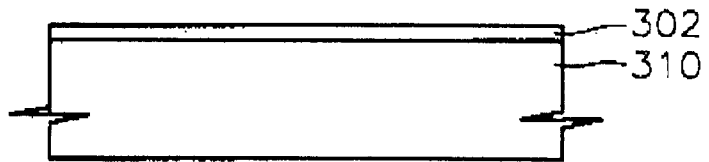
FIGS. 21 through 28 are cross-sectional views for illustrating a self-aligned contact hole forming method according to another embodiment of the present invention.

FIG. 20 is a graph showing a variation in the diameter of the bottom surface of a contact hole according to a variation in the ratio of polymer deposition to plasma etching, that is, the ratio of a duration of the polymer deposition step to a duration of the plasma etching step, when oxygen is added in the plasma etching step. It can be seen from FIG. 20 that the diameter of the bottom surface of a contact hole decreases as the ratio of polymer deposition to plasma etching increases, and that a reduction in the diameter of the bottom surface of a contact hole is suppressed in cases (●) where the flow rate of added oxygen is high.

Second Embodiment

In the present embodiment, a self-aligned contact hole is formed using a plasma etching method based on selective polymer deposition FIGS. 21 through 28 are cross-sectional views for illustrating a method of forming a self-aligned contact hole, according to the second embodiment of the present invention. First, referring to FIG. 21, an isolation film (not shown) defining an active region and a non-active region is formed on a semiconductor substrate 310 of a first conductivity type, for example, a p-type semiconductor substrate. The semiconductor substrate 310 can be a silicon-on-insulator (SOI) substrate. A gate dielectric film 302, for example, a thermal oxide film, is formed on the semiconductor substrate 310 to have a thickness of about 80 to 200 A.

Figure 22:
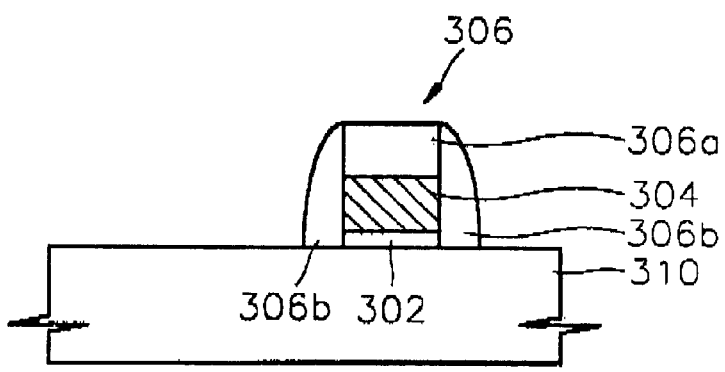

Referring to FIG. 22, a conductive film is formed to have a thickness of about 0.2 $\mu$m on the entire surface of the gate dielectric film 302, and a dielectric film is formed to have a thickness of about 0.1 to 0.2 $\mu$m on the resultant structure. Preferably, the conductive film is formed of doped polycrystal silicon, and the dielectric film is formed of a material which acts not only as an oxide blocking film but also as an anti-reflection film, for example, silicon nitride ($Si_3N_4$). The dielectric film 302 and the conductive film are sequentially patterned to form a gate pattern having a gate electrode 304 and a capping dielectric layer 306a sequentially stacked on the gate dielectric film 302. The capping dielectric layer 306a acts as an anti-reflection film during a photolithographic process for forming the gate pattern, so that a gate pattern having an excellent profile can be formed. Next, a silicon nitride film ($Si_3N_4$) is grown by low-pressure chemical vapor deposition (LPCVD) to have a thickness of 0.1 to 0.2 $\mu$m on the semiconductor substrate 310 on which the gate pattern has been formed. The silicon nitride film ($Si_3N_4$) is anisotropically etched, thereby forming a capping spacer 306b. In this way, a capping portion 306 having the capping dielectric layer 306a and the capping spacer 306b is completed.

Figure 23:
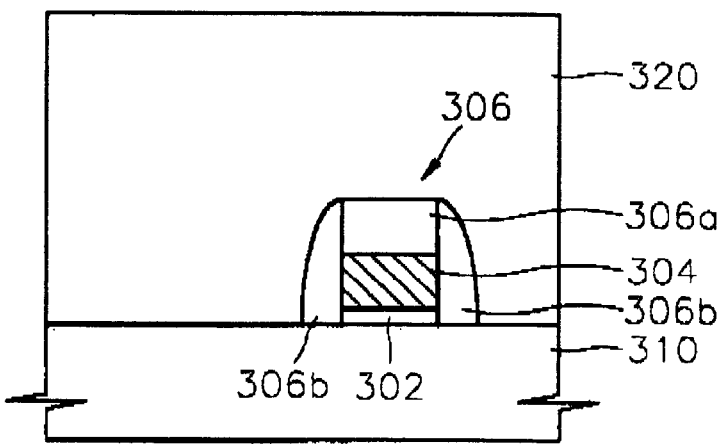

Referring to FIG. 23, a dielectric film 320, for example, a silicon oxide ($SiO_2$) layer obtained by chemical vapor deposition, is formed to have a thickness of about 1 $\mu$m on the semiconductor substrate 310 on which the capping portion 306 for covering the gate electrode 304 is formed.

Figure 24:
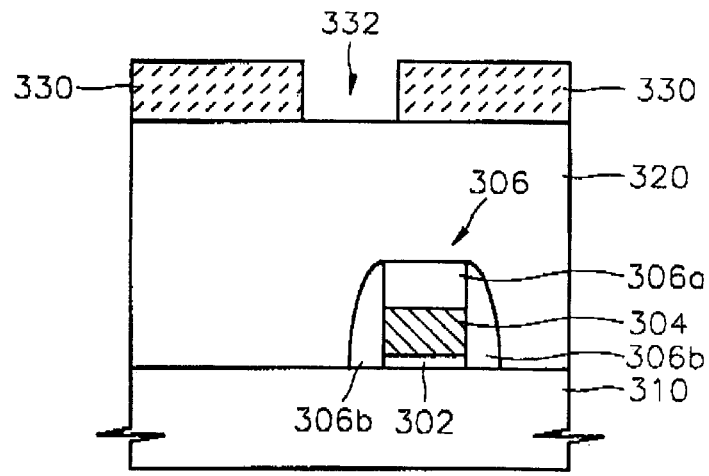

Referring to FIG. 24, the entire surface of the dielectric film 320 is coated with a photoresist. In order to maximize the resolution, the photoresist is formed thinly to a thickness of about 0.5 to 1.2 $\mu$m, for example, 0.7 $\mu$m. Then, the photoresist is exposed and developed using an ArF excimer laser light source to achieve high resolution, thereby forming a photoresist pattern 330 which defines a contact hole. The diameter of an aperture 332 in the photoresist pattern 330 is, for example, about 0.2 to 0.51 μm.

A wafer W on which the photoresist pattern 330 has been formed is introduced into the plasma reactor 101 as shown in FIG. 4. An etch gas is injected into the plasma reactor 101 into which the wafer W has been introduced, via an inlet 109, and a bias power supply 107 and a source power supply 103 apply power to the wafer support 105 on which the wafer W has been seated, and the plasma reactor 101, respectively. In this state, plasma etching is started.

$C_xF_y$-series or $C_aH_bF_c$-series gasses, which allow polymer formation, such as $CF_4$, $CHF_3$, $C_2F_6$, $C_4F_8$, $CH_2F_2$, $CH_3F$, $CH_4$, $C_2H_2$, or $C_4F_6$, can be used as the etch gas. Also, the plasma reactor 101 can be charged with an inert gas such as He, Ar, Xe, or I for allowing plasma to be formed stably and polymer to be deposited on a substrate stably and uniformly.

The source power supply 103 for generating plasma, and the bias power supply 107 for accelerating generated plasma, apply different amounts of RF power according to the types of plasma etching equipment. In plasma equipment used in this embodiment, the source power supply 103 and the bias power supply 107 apply RF power of between 2000 and 3000W and RF power of between 1000 and 1500W, respectively.

Figure 25:
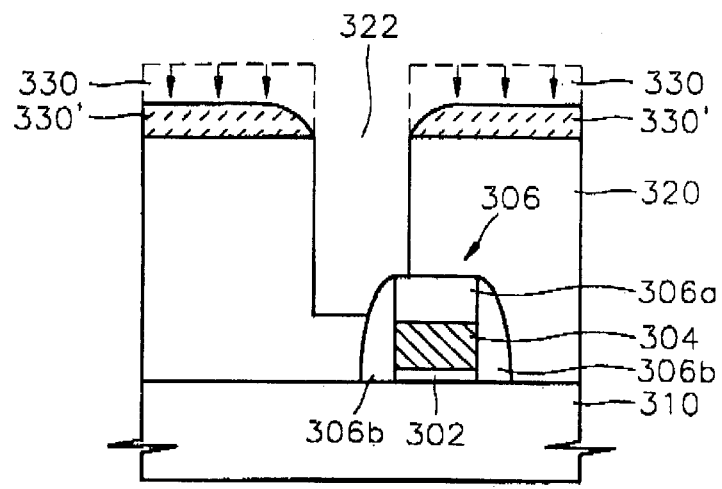

The average power of the source power supply 103 and the average power of the bias power supply 107 are set to be values described above. In this condition, when the dielectric film 320 is plasma etched using the photoresist pattern 330 as an etch mask for a predetermined period of time (about 1 to 3 minutes), the resultant structure of FIG. 25 is obtained. For example, when the dielectric film 320 formed of silicon oxide is etched for about 90 seconds using $C_4F_8$ as plasma gas, the dielectric layer 320 is etched by 0.8 μm, and the thickness of an upper photoresist pattern 330' is reduced to 0.4 to 0.6 μm. At this time, the capping dielectric layer 306a and the capping spacer 306b in the lower portion of the dielectric layer 320 are exposed by about 0.1 to 0.2 μm.

Figure 26:
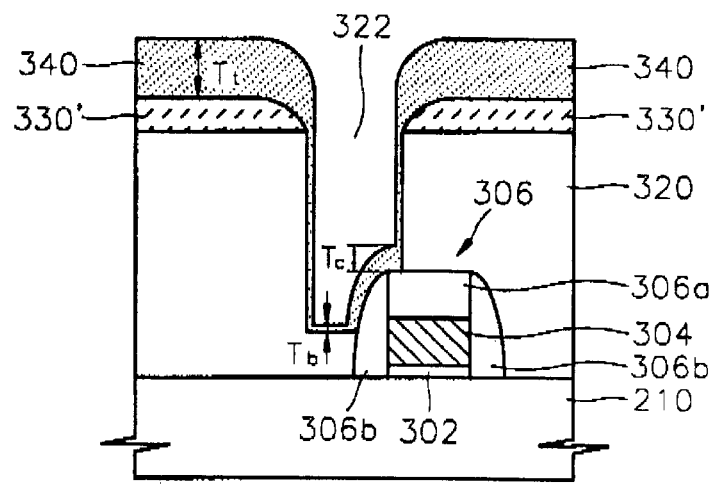

In a state as shown in FIG. 25, power from the bias power supply 107 is not applied, or a low level of power within a range where polymer deposition is more predominant than plasma etching, for example, RF power of 0 to 900W, is applied for a predetermined period of time (for about 15 to 40 seconds). Consequently, as shown in FIG. 26, polymer is deposited inside the contact hole 322 formed by the etching of the dielectric film 320, and on the upper surface of the photoresist pattern 330', thereby forming a polymer layer 340. Here, the thickness (Tt) of the polymer layer 340 on the photoresist pattern 330' is about 0.2 to 0.5 μm, which is the thickest, the thickness (Tb) of the polymer layer 340 on the bottom surface of the contact hole 322 is about 500 Å (=0.05 μm), which is the thinnest, and the thickness (Tc) of the polymer layer 340 on the exposed capping portion 306 is about 0.05 to 0.3 μm, which is the middle thickness.

As described above, the deposition thickness and profile of the polymer layer 340 vary with several variables such as the average power of a source power supply, the type of etching gas, the internal pressure of a reactor, and the substrate temperature. Therefore, a polymer layer 340 having a desired thickness and a desired profile can be obtained by controlling the variables considering the results of the above experiment.

Figure 2A:
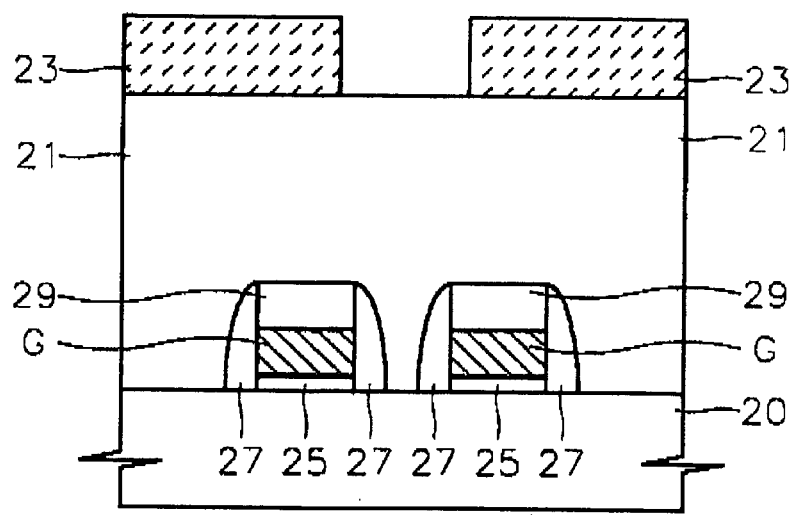
FIGS. 2A through 2B are cross-sectional views for illustrating a procedure of forming a self-aligned contact hole using the conventional dielectric film etching method.
Figure 2B:
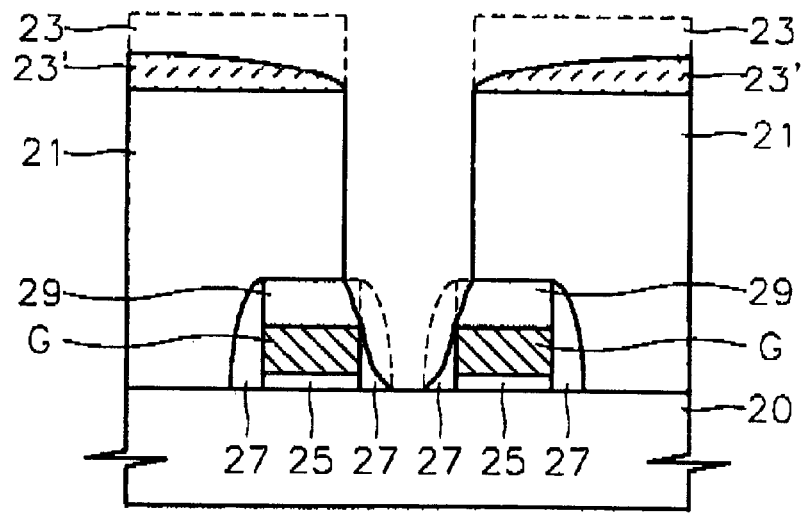

In this embodiment, the polymer layer 340 is formed on the photoresist pattern 330' to be used as an etch mask for supplementing or augmenting the thickness of the thinned photoresist pattern, and also formed on the exposed capping portion 306 to be used as an etch mask for preventing the exposure of the gate electrode 304. Hence, the polymer layer 340 formed on the capping portion 306 needs to have a thickness (Tc) capable of acting as an etch mask. That is, in contrast with the first embodiment, it is preferable that the difference between the thicknesses (Tt) of the polymer layer 340 on the photoresist pattern 330' and the thickness (Tb) of the polymer layer 340 on the bottom surface of the contact hole 322 is narrowed to secure an appropriate thickness (Tc) on the capping portion 306. In that case, though the thickness (Tb) of the polymer layer 340 on the bottom surface of the contact hole 322 also increases, the increased thickness is sufficiently effective in preventing a failure as shown in FIG. 2B since it is still small compared to the thicknesses (Tt) and (Tc). Considering the results of the above experiment, it is preferable to set the process conditions as described below to obtain the polymer layer 340 having the above-described deposition profile.

That is, referring to FIG. 16, during a polymer deposition step, the average power of a bias power supply is maintained at a low level, the average power of a source power supply is maintained at a low level 252, the substrate temperature is set to be a high level 262, and the internal pressure of a reactor is set to be a low level 272. Here, the average power of a bias power supply must be maintained at a low level during polymer deposition. However, likewise the first embodiment, the average power of a source power supply, the temperature of a substrate, and the internal pressure of a reactor may be set to be a low level, a high level, and a low level, respectively, or some or all of them can maintain the same level as the level that is established and maintained during plasma etching. Even if the average power of a source power supply, the substrate temperature, and the internal pressure of a reactor remain unchanged, the natural deposition profile of the polymer layer 340 as shown in FIG. 26 is maintained.

Figure 27:
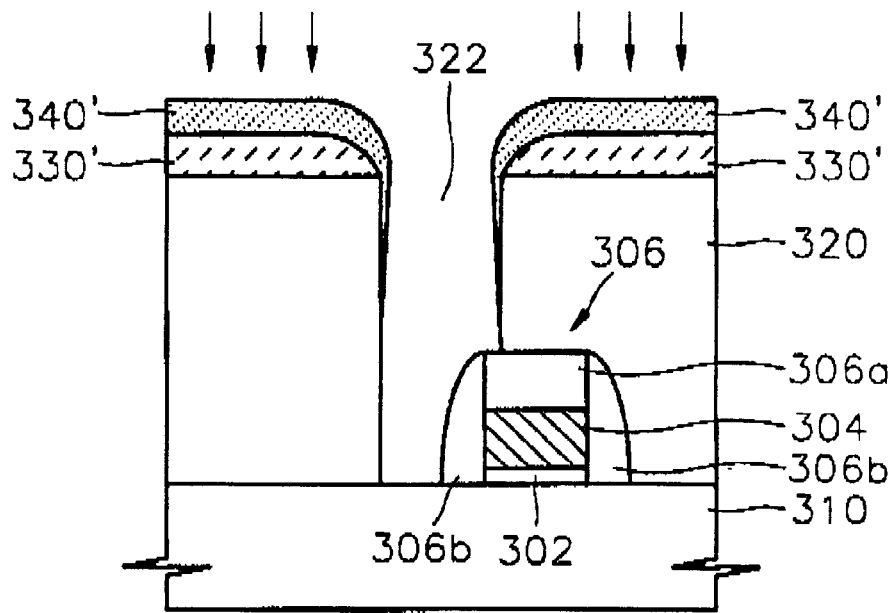

After the polymer layer 340 is formed as described above, as shown in FIG. 16, plasma etching is performed for a predetermined period of time (about 1–2 minutes), by returning the average power of the source power supply 103, the average power of the bias power supply 107, the substrate temperature, and the internal pressure of the reactor 101 to the levels in the plasma etching step. Accordingly, as shown in FIG. 27, the thinned photoresist pattern 330' and the polymer layer 340 act as an etch mask, and thus a self-aligned contact hole 322 having an excellent profile can be formed without an exposure of the gate electrode 304. During the plasma etching for 1–2 minutes, the dielectric film 320 is continuously etched, and thus the semiconductor substrate 310 is exposed. At this time, the polymer layer 340 is also plasma etched to become a polymer layer 340' having a thickness of about 0 to 0.2 μm.

Figure 28:
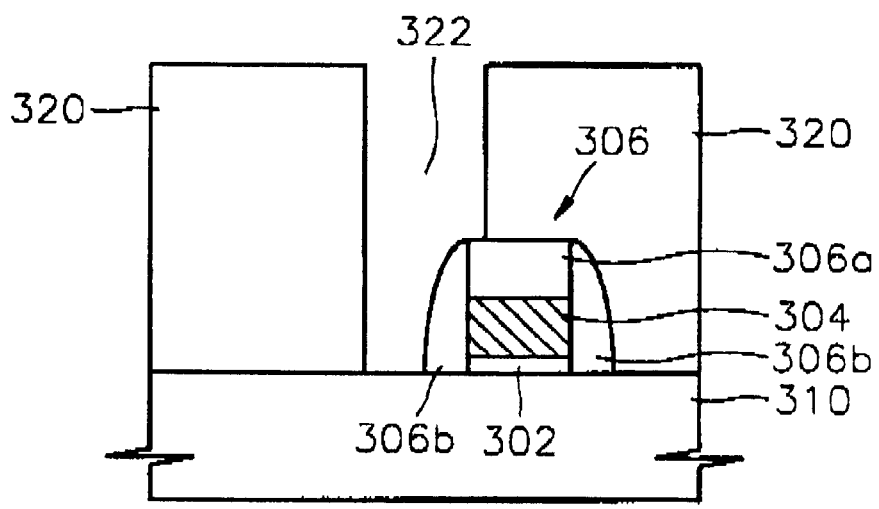

Thereafter, as shown in FIG. 28, the remaining polymer layer 340' and the remaining photoresist pattern 330' in FIG. 27 are removed, thereby completing the formation of a self-aligned contact hole 322.

Similar to the first embodiment, a self-aligned contact hole having a higher aspect ratio and an excellent profile can be formed by repeating one or more times the step of forming the polymer layer 240 on the photoresist pattern 330' and on the capping portion 306 and the step of performing plasma etching using the polymer layer 340 and the photoresist pattern 330' as an etch mask.

Also, similar to the first embodiment, a gas capable of removing polymer from the sidewall of the contact hole 322 may be further supplied in the plasma etch step, in order to prevent the diameter of the bottom surface of the contact hole 322 to be reduced.

The self-aligned contact hole formation method according to the second embodiment of the present invention uses a gate pattern as an example of a conductive layer pattern which is self-aligned, but it can also be applied to a bit line or a metal wiring instead of a gate pattern.

The self-aligned contact hole formation method according to the second embodiment of the present invention, in which a self-aligned contact hole is formed by performing polymer deposition to reduce the difference between the thickness (Tt) of a polymer layer on a photoresist pattern and the thickness (Tb) of a polymer layer on the bottom surface of a contact hole, can also be applied to a case in which contact holes 37 and 39 having different depths as shown in FIG. 3 are formed simultaneously. That is, in a structure as shown in FIG. 3, the thickness of a polymer layer on the bottom surface of the contact hole 37 which is shallower must be greater than that of a polymer layer on the bottom surface of the contact hole 39 which is deeper. However, the thicknesses of a polymer layer on the bottom surfaces of the contact holes 37 and 39 cannot be controlled independently, so that the thickness of a polymer layer on the bottom surface of the shallow contact hole 37 is increased by reducing the difference between the thickness (Tt) on a photoresist pattern and the thickness (Tb) on the bottom surface of a contact hole. In the case of FIG. 3, even if the bias power supply 107 is changed to a low level in the polymer deposition step, and the source power supply 103, the substrate temperature, and the internal pressure of the reactor 101 are maintained at the same levels as those in the plasma etching step, polymer is naturally deposited thicker on the bottom surface of the shallow contact hole 37 than on the bottom surface of the deep contact hole 39, so that a failure as shown in FIG. 3 can be prevented.

Although the invention has been described with reference to particular embodiments, it will be apparent to one of ordinary skill in the art that modifications of the described embodiments may be made without departing from the spirit and scope of the invention. For example, when the polymer deposition step and the plasma etching step are repeated one or more times in order to form a deep contact hole, the aspect ratio of a contact hole formed by the etching of a dielectric film increases as these steps are repeated. Accordingly, considering the results of the experiment shown in FIG. 6, the duration of the polymer deposition step can be gradually reduced as the number of times of repetition increases.

The specific values of the process conditions in the aforementioned embodiments can vary according to the type of plasma etching equipment used, and can depart from the exemplified ranges in some cases.

As described above, in a plasma etching method using selective polymer deposition according to the present invention, and a method of forming a contact hole using the plasma etching method, even if a thin photoresist mask is used, polymer is selectively deposited on only the photoresist mask, so that the photoresist mask, which is an etch mask, is reinforced. Therefore, dielectric film etching and contact hole formation, which provide a high resolution and an excellent profile, can be achieved.

Also, a contact hole having a very high aspect ratio and an excellent profile can be formed independently of the thickness of an initial thin photoresist mask by repeating one or more times the polymer deposition step and the plasma etching step according to the present invention.

According to the present invention, in order to form a self-aligned contact hole by plasma etching for a highly-integrated semiconductor device, polymer is selectively deposited on only a photoresist mask and a capping portion, which covers a conductive layer pattern, and then etched. Thus, a contact hole having an excellent profile can be formed, and the exposure of the conductive layer pattern can be prevented.

Furthermore, according to a contact hole forming method of the present invention, even if contact holes having different depths are formed simultaneously, contact holes having excellent profiles can be formed without a failure that a conductive layer on the bottom surface of a shallower contact hole is pierced.

What is claimed is:

1. A plasma etching method, in which a dielectric film on a wafer is etched by plasma using a photoresist pattern as a mask, the method comprising:
    (a) plasma etching an upper portion of the dielectric film using the photoresist pattern as a mask by establishing an average power of a power supply within a given range, to form an opening the dielectric film;
    (b) selectively depositing a polymer layer on the photoresist pattern, the polymer layer having a thick portion on the surface of the photoresist pattern and a substantially thinner portion on the surface of the opening in the dielectric film; and
    (c) plasma etching the remaining portion of the dielectric film using the photoresist pattern and the polymer layer as a mask by establishing the average power of the power supply within the given range.

2. The method of claim 1, wherein the dielectric film is etched to a depth by repeating steps (b) and (c) one or more times.

3. The method of claim 1, wherein the polymer depositing of step (b) is achieved by setting the average power of a bias power supply that is applied to the wafer to accelerate the plasma within a range that is lower than that of the plasma etching steps (a) and (c).

4. The method of claim 1, wherein a gas used for the etching of the dielectric film and the depositing of the polymer is $C_xF_y$-series or $C_aH_bF_c$-series gas.

5. The method of claim 4, wherein the gas further includes an inert gas to allow plasma to be stably produced and polymer to be stably and uniformly deposited on the substrate.

6. The method of claim 4, which further comprises supplying a gas, in step (c), for etching polymer deposited by step (b) on the sidewall of the opening in a dielectric film formed by step (a).

7. The method of claim 6, wherein the gas for etching the polymer is $O_2$, $N_2$, CO or $CO_2$.

8. The method of claim 1, wherein a conductive layer is formed in the lower portion of the dielectric film, and wherein a contact hole that exposes the conductive layer is formed by etching the dielectric film using the plasma etching steps (a) and (c).

9. The method of claim 8, wherein, during the depositing of the polymer in step (b), the average power of a source power supply that is applied to generate the plasma is set to a range that is higher than that of the plasma etching steps (a) and (c).

10. The method of claim 1, wherein a conductive layer pattern and a capping layer that covers the conductive layer pattern are formed in a lower portion of the dielectric film, and wherein a self-aligned contact hole that exposes the capping layer is formed by etching the dielectric film using the plasma etching steps (a) and (c).

11. The method of claim 10, wherein during the depositing of the polymer in step (b), the average power of a source power supply that is applied to generate the plasma is established within a range that is lower than that of the plasma etching steps (a) and (c).

12. The method of claim 1, wherein a first conductive layer is formed in a lower portion of the dielectric film, a second conductive layer is formed at a depth in the dielectric film, and first and second contact holes having different depths that expose the first and second conductive layers, respectively, are formed simultaneously by etching the dielectric film using the plasma etching steps (a) and (c).

13. The method of claim 12, wherein during the depositing of the polymer in step (b), the average power of a source power supply that is applied to generate the plasma, is set to a range that is lower than that of the plasma etching steps (a) and (c).

14. A contact hole forming method comprising:
(a) forming a dielectric film on a conductive layer on a substrate and forming a photoresist pattern on the dielectric film;
(b) plasma etching the dielectric film to form an opening therein, using the photoresist pattern as a mask by setting the average power of a bias power supply that is applied to the substrate to accelerate plasma to a high level within a defined range wherein plasma etching is more predominant than deposition of polymer;
(c) selectively forming a polymer layer on the photoresist pattern by setting the average power of the bias power supply to a low level within a defined range where polymer deposition is more predominant than plasma etching such that the polymer layer has a thick portion on the surface of the photoresist pattern and a substantially thinner portion on the surface of the opening in the dielectric film; and
(d) plasma etching the dielectric film using the photoresist pattern and the polymer layer as a mask by setting the average power of the bias power supply to the high level.

15. The method of claim 14, wherein a contact hole that exposes the conductive layer is formed by repeating steps (c) and (d) one or more times.

16. The method of claim 14, wherein, in step (c), the difference between the thickness of a polymer layer on the photoresist pattern and the thickness of a polymer layer on the bottom surface of a contact hole formed by etching the dielectric film is increased by setting the temperature of the substrate to a level that is lower than that of the plasma etching steps (b) and (d).

17. The method of claim 14, wherein, in step (c), the difference between the thickness of a polymer layer on the photoresist pattern and the thickness of a polymer layer on the bottom surface of a contact hole formed by etching the dielectric film is increased by setting the internal pressure of a reactor to a level that is higher than that of the plasma etching steps (b) and (d).

18. The method of claim 14, wherein, in step (c), the difference between the thickness of a polymer layer on the photoresist pattern and the thickness of a polymer layer on the bottom surface of a contact hole formed by etching the dielectric film is increased by setting the average power of a source power supply that is applied to generate the plasma to a level that is higher than that of the plasma etching steps (b) and (d).

19. The method of claim 14, which further comprises supplying a gas, in step (d), for etching polymer deposited by step (c) on the sidewall of a hole in a dielectric film formed by step (b).

20. The method of claim 19, wherein the gas for etching the polymer is $O_2$, $N_2$, CO or $CO_2$.

21. A self-aligned contact hole forming method comprising:
(a) successively forming a first dielectric film and a conductive layer pattern on a semiconductor substrate;
(b) forming a capping layer to cover the conductive layer pattern;
(c) forming a second dielectric film overlying the conductive layer pattern and the capping layer;
(d) forming a photoresist pattern on the second dielectric film;
(e) performing primary plasma etching on the second dielectric film to form an opening therein using the photoresist pattern as a mask to expose a portion of the capping layer by establishing an average power of a power supply within a given range;
(f) selectively depositing polymer on the photoresist pattern and on the exposed capping layer the polymer layer having a thick portion on the surface of the photoresist pattern and a substantially thinner portion on the surface of the opening in the dielectric film; and
(g) performing secondary plasma etching on the second dielectric film using the photoresist pattern, the capping layer and the polymer layer on the photoresist pattern and on the capping layer as a mask by establishing the average power of the power supply within the given range.

22. The method of claim 21, wherein the primary plasma etching of step (e) comprises:
(e1) plasma etching the second dielectric film using the photoresist pattern as a mask by setting the average power of the bias power supply that is applied to the substrate to accelerate plasma to a high level within a defined range wherein plasma etching is more predominant than polymer deposition;
(e2) selectively forming a polymer layer on the photoresist pattern by setting the average power of the bias power supply to a low level within a defined range wherein polymer deposition is more predominant than plasma etching; and
(e3) plasma etching the second dielectric film using the photoresist pattern and the polymer layer as a mask by setting the average power of the bias power supply to the high level,
wherein the capping layer is exposed by repeating steps (e2) and (e3) one or more times.

23. The method of claim 21, wherein a contact hole that exposes the conductive layer is formed by repeating steps (f) and (g) one or more times.

24. The method of claim 21, wherein, in step (f), the polymer layer is formed by setting the average power of the bias power supply that is applied to the substrate to accelerate plasma to a low level within a defined range wherein polymer deposition is more predominant than plasma etching.

25. The method of claim 21, wherein, in step (f) of forming a polymer layer, the difference between the thickness of the polymer layer stacked on the photoresist pattern and the thickness of the polymer layer on the capping layer exposed by the etching of the second dielectric film is reduced by setting the temperature of the substrate to a level that is higher than that of the plasma etching steps (e) and (g).

26. The method of claim 21, wherein, in step (f) of forming a polymer layer, the difference between the thickness of the polymer layer stacked on the photoresist pattern and the thickness of the polymer layer on the capping portion exposed by the etching of the second dielectric film is reduced by setting the internal pressure of a reactor to a level which is lower than that of the plasma etching steps (e) and (g).

27. The method of claim 21, wherein, in step (f) of forming a polymer layer, the difference between the thickness of the polymer layer stacked on the photoresist pattern and the thickness of the polymer layer on the capping layer exposed by the etching of the second dielectric film is reduced by setting the average power of a source power supply that is applied to generate the plasma to a level that is lower than that of the plasma etching steps (e) and (g).

28. The method of claim 21, which further comprises supplying a gas, in step (g), for etching polymer deposited by step (f) on the sidewall of the hole in the second dielectric film formed by step (e).

29. The method of claim 28, wherein the gas for etching the polymer is $O_2$, $N_2$, CO or $CO_2$.

30. A plasma etching method, in which a dielectric film on a wafer is etched by plasma with a photoresist pattern as a mask using a plasma equipment comprising a source power supply and a bias power supply, the method comprising:
   (a) plasma etching a first portion of the dielectric film to form an opening therein, using the photoresist pattern as a mask for a first period of time;
   (b) selectively depositing polymer on the photoresist pattern, thereby forming a polymer layer thereon for a second period of times the polymer layer having a thick portion on the surface of the photoresist pattern and a substantially thinner portion on the surface of the opening in the dielectric film; and
   (c) plasma etching a second portion of the dielectric film using the photoresist pattern and the polymer layer as a mask for a third period of time.

31. The plasma etching method of claim 30, wherein the first period of time is approximately 1 to 3 minutes, and wherein, during the plasma etching, the source power supply and the bias power supply apply RF power of between 2000 and 3000W and RF power of between 1000 and 1500W, respectively.

32. The plasma etching method of claim 30, wherein the second period of time is approximately 15 to 40 seconds, and wherein the depositing of the polymer is performed with RF power of approximately between 0 and 900W.

33. The plasma etching method of claim 30, wherein the third period of time is approximately 1 to 2 minutes, and wherein, during the plasma etching, the source power supply and the bias power supply apply RF power of approximately between 2000 and 3000W and RF power of approximately between 1000 and 1500W, respectively.

34. A method of forming a contact hole in a dielectric film, the method comprising:
   (a) plasma etching an opening in an upper portion of a dielectric film, using a photoresist pattern as a mask;
   (b) depositing a polymer layer having a thick portion on the surface of the photoresist patter and a substantially thinner portion on the surface of the opening in the dielectric film; and
   (c) thereafter plasma etching the remaining portion of the dielectric film below the opening to form a contact hole in the dielectric film, using the photoresist pattern and the thick portion of the polymer layer deposited on the photoresist pattern as a mask.

35. The method of claim 34, wherein the depositing a polymer layer supplement a thickness of the mask.

* * * * *

UNITED STATES PATENT AND TRADEMARK OFFICE
CERTIFICATE OF CORRECTION

PATENT NO. : 6,617,253 B1
DATED : September 9, 2003
INVENTOR(S) : Chu et al.

It is certified that error appears in the above-identified patent and that said Letters Patent is hereby corrected as shown below:

Column 13,
Line 4, "to 0.51 $\mu$m." should read -- to 0.5 $\mu$m. --.

Column 19,
Line 30, "of times the" should read -- of time, the --.

Column 20,
Line 24, "photoresist patter and" should read -- photoresist pattern and --.

Signed and Sealed this

Twentieth Day of July, 2004

JON W. DUDAS
*Acting Director of the United States Patent and Trademark Office*